US006753128B2

(12) United States Patent
Lee et al.

(10) Patent No.: US 6,753,128 B2
(45) Date of Patent: Jun. 22, 2004

(54) PHOTORESIST ADDITIVE FOR PREVENTING ACID MIGRATION AND PHOTORESIST COMPOSITION COMPRISING THE SAME

(75) Inventors: Geun Su Lee, Kyoungki-do (KR); Jae Chang Jung, Kyoungki-do (KR); Ki Soo Shin, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/272,072

(22) Filed: Oct. 16, 2002

(65) Prior Publication Data
US 2003/0082481 A1 May 1, 2003

(30) Foreign Application Priority Data

Oct. 25, 2001 (KR) ........................................ 2001-65913

(51) Int. Cl.[7] .............................................. G03F 7/038
(52) U.S. Cl. ..................... 430/270.1; 564/427; 564/428
(58) Field of Search ....................... 430/270.1; 564/427, 564/428

(56) References Cited

U.S. PATENT DOCUMENTS

| 4,049,457 A | * | 9/1977 | Rice et al. ................ 430/270.1 |
| 4,312,934 A | * | 1/1982 | Rice et al. .................. 430/294 |
| 5,609,989 A | * | 3/1997 | Bantu et al. .............. 430/270.1 |
| 5,667,938 A | * | 9/1997 | Bantu et al. .............. 430/270.1 |
| 5,733,705 A | * | 3/1998 | Bantu et al. .............. 430/270.1 |
| 6,045,967 A | | 4/2000 | Jung et al. |
| 6,316,565 B1 | | 11/2001 | Jung et al. |

FOREIGN PATENT DOCUMENTS

| EP | 1014193 | * | 12/1999 | ........... G03F/7/004 |
| JP | 11-203937 | * | 7/1999 | ............ G03C/1/89 |
| WO | 97/43695 | * | 11/1997 | ........... G03F/7/004 |

OTHER PUBLICATIONS

English Language machine translation of JP 11–103937.*

* cited by examiner

*Primary Examiner*—Mark F. Huff
*Assistant Examiner*—Amanda C Walke
(74) *Attorney, Agent, or Firm*—Marshall, Gerstein & Borun LLP

(57) ABSTRACT

Photoresist additives for preventing the acid generated in the exposed area during the course of a photolithography process from being diffused to the unexposed area, photoresist compositions containing the same, and a process for forming a photoresist pattern using the same. Photoresist compositions comprising the disclosed additive can prevent acid diffusion effectively even if the additive is used in low concentrations, thereby improving LER, resulting in excellent profiles and lowering optimum irradiation energies.

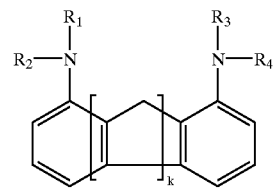

Formula 1 wherein, $R_1$, $R_2$, $R_3$, $R_4$ and k are as defined herein.

4 Claims, 2 Drawing Sheets

PHOTORESIST ADDITIVE FOR PREVENTING ACID MIGRATION AND PHOTORESIST COMPOSITION COMPRISING THE SAME

BACKGROUND

1. Technical Field

Photoresist additives for preventing acid migration and photoresist compositions containing the same are disclosed. More specifically, photoresist additives are disclosed which prevent acid generated in an exposed area during the course of a photolithography process from diffusing or migrating to an unexposed area. Photoresist compositions containing the same and a process for forming a photoresist pattern using the same are also disclosed.

2. Description of the Related Art

Recently, chemical amplification-type DUV (deep ultra violet) photoresists have proven to be useful in achieving high sensitivity in processes for forming ultrafine patterns in the manufacture of semiconductors. These photoresists are prepared by blending a photoacid generator with a polymer matrix having acid labile structures.

According to the reaction mechanism of such a photoresist, the photoacid generator generates acid when it is irradiated by the light source, and the main chain or branched chain of the polymer matrix in the exposed or irradiated portion reacts with the generated acid and is decomposed or cross-linked, so that the polarity of the polymer is considerably altered. This alteration of polarity results in a solubility difference in the developing solution between the irradiated exposed area and the unexposed area, thereby forming a positive or negative image of a mask on the substrate.

It is necessary to prevent acid generated in the exposed area during the course of a photolithography process from diffusing or migrating to the unexposed area so as to improve resolution of the resulting pattern and to obtain a superior profile.

In order to prevent the acid diffusion, an amine or amide compound has been added to a chemical amplification type photoresist composition with an amount ranging from 5 to 30% per mole of the photoacid generator.

However, excessive use of amine or amide has caused light absorbance and optimum irradiation energy to increase, thereby deteriorating the productivity of the exposing process.

Moreover, a line edge roughness (hereinafter, abbreviated as 'LER') between 10–20 nm has been commonly shown in forming photoresist pattern of 110 nm or less, leading to inefficiencies in the process and final products with reduced stability.

SUMMARY OF THE DISCLOSURE

Accordingly, photoresist additives are disclosed which can prevent diffusion of acid generated in the exposed area effectively. Photoresist compositions containing the same are also disclosed.

A process for forming an ultrafine pattern by using the disclosed photoresist compositions and a semiconductor element manufactured according to the disclosed process are also disclosed.

DETAILED DESCRIPTION OF THE PRESENTLY PREFERRED EMBODIMENTS

Figure 1:
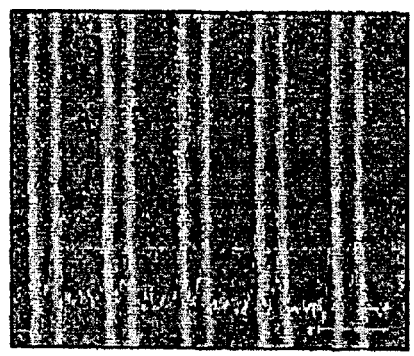
FIG. 1 is a photograph of a photoresist pattern obtained using the procedure set forth in Example 1.

An additive for preventing acid diffusion is disclosed, wherein the additive is represented by Formula 1:

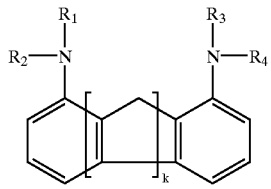

Formula 1 wherein, $R_1$, $R_2$, $R_3$ and $R_4$ are individually selected from the group consisting of H and linear or branched $C_1$–$C_{10}$ alkyl, and k is 0 or 1.

The above compound of Formula 1 can also be represented by Formula 1a and Formula 1b.

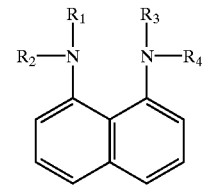

Formula 1a

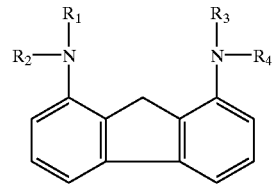

Formula 1b

The above compound of Formula 1a is preferably N,N,N',N'-tetramethyl-1,8-naphthalenediamine or N,N'-dimethyl-1,8-naphthalenediamine, and the above compound of Formula 1b is preferably N,N,N',N'-tetramethyl-1,8-diaminofluorene or N,N'-dimethyl-1,8-diaminofluorene.

These compounds are proton sponges which have very strong basicity, having pKa ranging from about 12 to about 16. They control diffusion of acid effectively by being added into photoresist compositions.

That is, they prevent the acid generated in the exposed area from being diffused into the unexposed area by absorbing the acids. As a result, excellent profiles can be obtained after developing because physical property of photoresist of unexposed region doesn't change.

In addition, another aspect of the present invention provides a photoresist composition comprising (i) additive represented by the above Formula 1 for preventing acid diffusion; (ii) a base resin (iii) a photoacid generator; and (iv) an organic solvent.

The amount of additive of Formula 1 ranges from about 1 to about 10% by mole of the photoacid generator employed.

Any of the customary base resins (photoresist polymers), photoacid generators and organic solutions which are added into the conventional chemical amplification type photoresist composition, can be used. Some of them are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001).

Typically, the base resin has ring structure having the cycloolefin back bone. It is preferable that the base resin comprises repeating unit prepared by radical additional polymerization of cycloolefin comonomers with functional groups and the ring structures of the cycloolefin comonomers remains in the main chain of repeating unit. The functional groups are acid labile group which has effect on inhibition dissolution of base resin and carboxylic group.

More preferably, the base resin comprises cycloolefin comonomer with hydroxy alkyl functional group in order to improve adhesiveness to wafer and control sensitivity.

An exemplary base resin comprises repeating unit represented by the following Formula 2. The repeating unit comprises 2-hyroxyethyl bicyclo[2,2,1]hept-5-ene-2-carboxylate (m=1) or 2-hydroxy bicyclo[2,2,2]oct-5-ene-2-carboxylate (m=2) in order to improve adhesiveness to wafer.

Formula 2

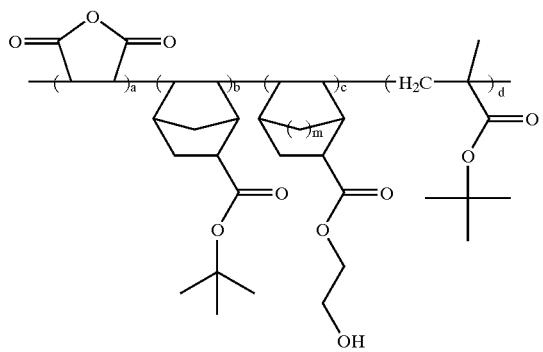

wherein, a:b:c:d is 30–50 mole %:20–50 mole %:1–30 mole %:1–45 mole % and m is 1 or 2.

Preferred photoacid generators are diazomethan derivatives, glyoxym derivatives and benzyltosylate derivatives which have low light absorbance at 193 nm and 248 nm wavelength, for example phthalimidotrifluoromethane sulfonate, dinitrobenzyltosylate, n-decyl disulfone, naphthylimido trifluoromethane sulfonate or mixtures thereof are preferably used. And sulfide type compound or onium type compound which also have low light absorbance at 193 nm and 248 nm, for example diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate or mixtures thereof are also used for photo acid generator.

The amount of photoacid generator ranges from about 0.05 to about 10% by weight of the base resin employed. It has been found that when the photoacid generator is used in the amount less than about 0.05%, it lowers photosensitivity of the photoresist composition, and when the photoacid generator is used in the amount greater than about 10%, it results in a poor pattern formation due to its high absorption.

On the other hand, preferred organic solvents for photoresist composition are methyl 3-methoxypropionate, ethyl 3-ethoxypropionate, propylene glycol methyl ether acetate, cyclohexanone, 2-heptanone, ethyl lactate or mixture thereof.

The amount of organic solvent ranges from about 200 to about 1000% by weight of the photoresist polymer to coat the photoresist in a wanted thickness. It has been found that when the organic solvent is used in the amount of 500 wt %, a thickness of the photoresist is about 0.51 μm.

A process for forming a photoresist pattern comprises:

(a) coating the photoresist composition described above on a wafer to form a photoresist film;

(b) exposing the photoresist film to light using an exposer; and (c) developing the exposed photoresist film to obtain a photoresist pattern.

The process for forming the photoresist pattern can further include a soft baking which is performed before the step (b) and/or a post baking step which is performed after the step (b). Preferably, the soft and post baking steps are performed at a temperature ranging from about 70 to about 200° C.

Exemplary light sources which are useful for forming the photoresist pattern include VUV (157 nm), ArF (193 nm), KrF (248 nm), E-beam, EUV (13 nm), ion beam or X-ray. Preferably, the irradiation energy in the step (b) ranges from about 0.1 mJ/cm$^2$ to about 50 mJ/cm$^2$.

On the other hand, the step (c) can be performed in alkaline developing solution which is preferably a TMAH aqueous solution with a concentration ranging from about 0.01 to about 5 wt %.

Semiconductor devices can, of course, be manufactured using the photoresist compositions described above.

The disclosed compounds and photoresist compositions containing the same will now be described in more details by referring to examples below, which are not intended to be limiting.

EXAMPLE 1

Preparation of Photoresist Compositions and Formation of FIG. (1)

To 100 g of propylene glycol methyl ether acetate was added 10 g of compound of Formula 2 (wherein m=1) as a base resin, 0.006 g of N,N,N',N'-tetramethyl-1,8-naphthalenediamine as an additive and, 0.06 g of phthalimidotrifluoromethane sulfonate and 0.06 g of triphenylsulfonium triflate as photoacid generators. The resulting mixture was stirred and filtered through 0.20 μm filter to obtain a photoresist composition.

The photoresist composition thus prepared was spin-coated on a bare silicon wafer to form a thin photoresist film, and soft-baked at 140° C. for 90 seconds. After soft baking, the photoresist was exposed to light using a ArF laser exposer, and then post-baked at 140° C. for 90 seconds. When the post-baking was completed, it was developed in 2.38 wt % aqueous TMAH solution for 40 seconds, to obtain 0.11 μm L/S photoresist pattern. As a result, optimum irradiation energy was 13 mJ/cm² and LER was 9.4 nm (see FIG. 1).

160 nm of randomly-selected pattern length was divided into 32 points, and critical dimension of each point was measured using Hitach SEM 8840 (□120K), and LER was determined as 3σ (wherein σ is standard deviation).

EXAMPLE 2

Preparation of Photoresist Compositions and Formation of FIG. (2)

Figure 2:
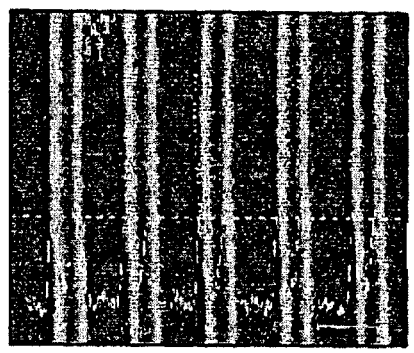
FIG. 2 is a photograph of a photoresist pattern obtained using the procedure set forth in Example 2.

The procedure of Example 1 was repeated using 0.006 g of N,N'-dimethyl-1,8-naphthalenediamine instead of 0.006 g of N,N,N',N'-tetramethyl-1,8-naphthalenediamine to obtain the pattern of 0.11 μm L/S pattern. As a result, optimum irradiation energy was 10.5 mJ/cm² and LER was 13 nm (see FIG. 2).

EXAMPLE 3

Preparation of Photoresist Compositions and Formation of FIG. (3)

Figure 3:
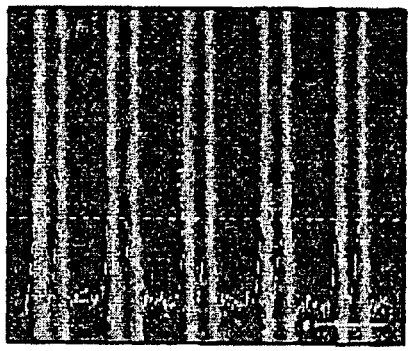
FIG. 3 is a photograph of a photoresist pattern obtained using the procedure set forth in Example 3.

The procedure of Example 1 was repeated using 0.006 g of N,N,N',N'-tetramethyl-1,8-diaminofluorene instead of 0.006 g of N,N,N',N'-tetramethyl-1,8-naphthalenediamine to obtain the pattern of 0.11 μm L/S pattern. As a result, optimum irradiation energy was 15 mJ/cm and LER was 12 nm (see FIG. 3).

EXAMPLE 4

Preparation of Photoresist Compositions and Formation of FIG. (4)

Figure 4:
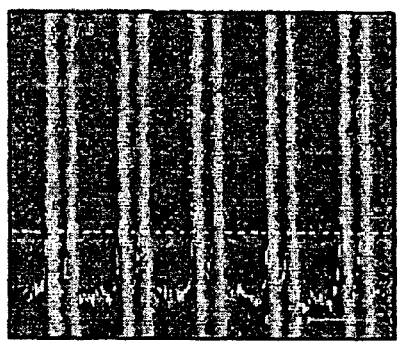
FIG. 4 is a photograph of a photoresist pattern obtained using the procedure set forth in Example 4.

The procedure of Example 1 was repeated using 0.006 g of N,N'-dimethyl-1,8-diaminofluorene instead of 0.006 g of N,N,N',N'-tetramethyl-1,8-naphthalenediamine to obtain the pattern of 0.11 μm L/S pattern. As a result, optimum irradiation energy was 11 mJ/cm² and LER was 11.6 nm (see FIG. 4).

COMPARATIVE EXAMPLE 1

Preparation of Photoresist Compositions and Formation of FIG. (5)

Figure 5:
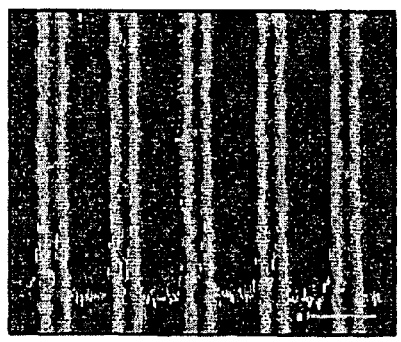
FIG. 5 is a photograph of a photoresist pattern obtained using the procedure set forth in Comparative Example 1.

The procedure of Example 1 was repeated using 0.006 g of trioctylamine instead of 0.006 g of N,N,N',N'-tetramethyl-1,8-naphthalenediamine to obtain the pattern of 0.11 μm L/S pattern. As a result, optimum irradiation energy was 16.7 mJ/cm² and LER was 14.3 nm (see FIG. 5).

COMPARATIVE EXAMPLE 2

Preparation of Photoresist Compositions and Formation of FIG. (6)

Figure 6:
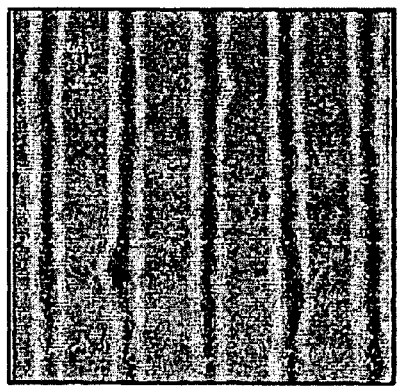
FIG. 6 is a photograph of a photoresist pattern obtained using the procedure set forth in Comparative Example 2.

The procedure of Example 1 was repeated without any additive to obtain the pattern of 0.12 μm L/S pattern. As a result, optimum irradiation energy was 37.4 mJ/cm² and LER was 16 nm or more (see FIG. 6).

As discussed earlier, photoresist compositions comprising an additive according to this disclosure can effectively prevent acid diffusion even if the additive is used in low concentrations. Use of the additives disclosed herein improve LER, result in improved profiles and lower the optimum irradiation energy.

What is claimed is:

1. A photoresist composition comprising a photoresist additive for preventing acid diffusion, wherein the additive is represented by Formula 1:

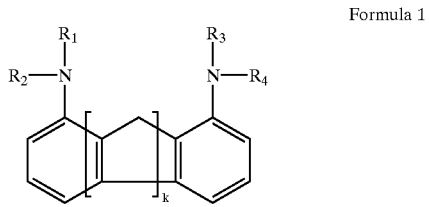

Formula 1 wherein, $R_1$, $R_2$, $R_3$ and $R_4$ are individually selected from the group consisting of H, linear $C_1$–$C_{10}$ alkyl and branched $C_1$–$C_{10}$ alkyl, and k is 1.

2. The composition according to claim 1, wherein the additive is selected from the group consisting of N,N,N',N'-tetramethyl-1,8-diaminofluorene and N,N'-dimethyl-1,8-diaminofluorene.

3. A photoresist composition comprising the additive of claim 1, a base resin, a photoacid generator and an organic solvent.

4. The photoresist composition according to claim 3, wherein the additive is present in an amount ranging from about 0.5 to about 20% by weight of the photoacid generator.

* * * * *

UNITED STATES PATENT AND TRADEMARK OFFICE
CERTIFICATE OF CORRECTION

PATENT NO. : 6,753,128 B2
DATED : June 22, 2004
INVENTOR(S) : Geun-Su Lee et al.

It is certified that error appears in the above-identified patent and that said Letters Patent is hereby corrected as shown below:

<u>Title page,</u>
Item [75], Inventors, please delete "Seoul" and replace with -- Kyoungki-do --.

Signed and Sealed this

Seventh Day of December, 2004

JON W. DUDAS
*Director of the United States Patent and Trademark Office*